(12) United States Patent
Choi et al.

(10) Patent No.: US 12,279,479 B2
(45) Date of Patent: Apr. 15, 2025

(54) SURFACE PROTECTION FILM AND METHOD FOR MANUFACTURING ORGANIC LIGHT-EMITTING ELECTRONIC DEVICE

(71) Applicant: LG CHEM, LTD., Seoul (KR)

(72) Inventors: Jeong Min Choi, Daejeon (KR); Hyun Cheol Kim, Daejeon (KR); Sojin Kim, Daejeon (KR); Hyungoo Kang, Daejeon (KR); Jae Seung Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 658 days.

(21) Appl. No.: 17/295,386

(22) PCT Filed: Jan. 22, 2020

(86) PCT No.: PCT/KR2020/001106
§ 371 (c)(1),
(2) Date: May 19, 2021

(87) PCT Pub. No.: WO2020/153754
PCT Pub. Date: Jul. 30, 2020

(65) Prior Publication Data
US 2022/0013747 A1     Jan. 13, 2022

(30) Foreign Application Priority Data

Jan. 25, 2019 (KR) .................. 10-2019-0010015

(51) Int. Cl.
*H10K 59/12* (2023.01)
*H10K 50/842* (2023.01)
*H10K 50/844* (2023.01)
*H10K 59/40* (2023.01)
(Continued)

(52) U.S. Cl.
CPC ..... *H10K 59/1201* (2023.02); *H10K 50/8426* (2023.02); *H10K 50/844* (2023.02); *H10K 59/12* (2023.02); *H10K 59/40* (2023.02); *H10K 59/8722* (2023.02); *H10K 59/873* (2023.02); *H10K 71/00* (2023.02)

(58) Field of Classification Search
None
See application file for complete search history.

(56) References Cited

U.S. PATENT DOCUMENTS

| 6,391,400 B1 * | 5/2002 | Russell ............ B32B 17/10036 |
| | | 359/359 |
| 9,458,364 B2 | 10/2016 | Inao et al. |
| 10,727,127 B2 | 7/2020 | Morikazu et al. |

(Continued)

FOREIGN PATENT DOCUMENTS

| JP | 2017-031278 A | 2/2017 |
| JP | 2017-039859 A | 2/2017 |

(Continued)

OTHER PUBLICATIONS

Machine Translation KR20180107732A.*
Machine Translation of JP201755099.*

*Primary Examiner* — Christopher T Schatz
(74) *Attorney, Agent, or Firm* — Rick Lam (57) ABSTRACT

The present disclosure relates to a surface protective film and a method for manufacturing an organic light emitting electronic device.

8 Claims, 2 Drawing Sheets

(51) Int. Cl.
*H10K 59/80* (2023.01)
*H10K 71/00* (2023.01)

(56) References Cited

U.S. PATENT DOCUMENTS

| | | | | |
|---|---|---|---|---|
| 2006/0251892 | A1* | 11/2006 | Husemann | C09J 7/29 |
| | | | | 428/354 |
| 2013/0017392 | A1* | 1/2013 | Inao | C08G 18/4825 |
| | | | | 428/336 |
| 2013/0280527 | A1 | 10/2013 | Niimi et al. | |
| 2017/0283667 | A1 | 10/2017 | Kawasaki | |
| 2018/0112106 | A1* | 4/2018 | Yeon | C09J 9/00 |

FOREIGN PATENT DOCUMENTS

| | | | |
|---|---|---|---|
| JP | 2017155099 A | 9/2017 | |
| JP | 2018114554 A | 7/2018 | |
| KR | 10-2013-0119360 A | 10/2013 | |
| KR | 10-2016-0150023 A | 12/2016 | |
| KR | 10-2017-0115434 A | 10/2017 | |
| KR | 10-2017-0135512 A | 12/2017 | |
| KR | 10-2018-0104141 A | 9/2018 | |
| KR | 10-2018-0107732 A | 10/2018 | |
| WO | 2011-122178 A1 | 10/2011 | |
| WO | WO-2017047889 A1 * | 3/2017 | C08F 265/06 |

* cited by examiner

SURFACE PROTECTION FILM AND METHOD FOR MANUFACTURING ORGANIC LIGHT-EMITTING ELECTRONIC DEVICE

CROSS-REFERENCE TO RELATED APPLICATIONS

This application is a National Phase entry pursuant to 35 U.S.C. § 371 of International Application No. PCT/KR2020/001106 filed on Jan. 22, 2020, and claims priority to and the benefits of Korean Patent Application No. 10-2019-0010015, filed with the Korean Intellectual Property Office on Jan. 25, 2019, the entire contents of which are incorporated herein by reference.

TECHNICAL FIELD

The present application relates to a surface protective film and a method for manufacturing an organic light emitting electronic device using the surface protective film.

BACKGROUND ART

A plastic substrate used as a substrate material for a flexible display has a problem in that gas barrier characteristics of moisture, oxygen, and the like are remarkably low. Thus, in the related art, the problem of the plastic substrate is alleviated by forming a barrier film to which various materials and structures are applied on the substrate.

However, recently, as existing barrier films are no longer used, there is a need for developing a surface protective film for a process capable of protecting a thin film encapsulation (TFE) layer during a process of manufacturing a flexible optical element. A surface protective film for a process is a film that protects a thin film encapsulation layer for a moment, is attached to the thin film encapsulation layer during the process to prevent contamination or damage of the surface of the thin film encapsulation layer during the process, and is removed when the process is completed.

As physical properties required for the surface protective film, first, an adhesive provided on the surface protective film needs to be well attached to the surface of an adherend, and the surface protective film can be removed with a low peel strength during the removing step, so that damage to the adherend should be able to be prevented. Second, after the removal of the surface protective film, the residue of the adhesive is small and contamination of the adherend should be able to be prevented.

PRIOR ART DOCUMENT

Patent Document

Korean Patent No. 10-1756828

DISCLOSURE

Technical Problem

In order to reduce the adhesive strength of an adhesive as a urethane-based adhesive in the related art, the adhesive strength is controlled by adding a plasticizer. However, when the plasticizer is added, a low adhesive strength can be realized, but since there occurs a phenomenon (migration) in which the plasticizer is lost by diffusing into other materials which are brought into contact with the surface of a product, it is difficult to realize low residue characteristics due to the occurrence of surface contamination. A problem of the present invention is to provide an adhesive layer in which a low adhesive strength is realized without including a plasticizer.

Technical Solution

An exemplary embodiment of the present specification provides a surface protective film including: a base layer; and an adhesive layer provided on one surface of the base layer, in which the adhesive layer includes a cured product of an adhesive composition including a urethane polymer; an acrylic polymer; and a curing agent, and a peel strength is 0.5 gf/in or more and 10 gf/in or less when a surface opposite to a surface of the adhesive layer on which the base layer is provided is peeled off from glass at a peel speed of 1.8 m/min and a peel angle of 180°.

Another exemplary embodiment of the present specification provides a method for manufacturing an organic light emitting electronic device, the method including: attaching an adhesive layer of the above-described surface protective film onto an encapsulation layer of an organic light emitting element.

Advantageous Effects

According to the present invention, it is possible to provide a surface protective film in which damage or contamination of the surface of an adherend is low after the detachment because an adhesive layer can be removed with a low peel strength due to low adhesive strength to the surface of the adherend.

EXPLANATION OF REFERENCE NUMERALS AND SYMBOLS

11A: First anti-static layer
11B: Second anti-static layer
11C: Third anti-static layer
11D: Fourth anti-static layer
110: Base layer
111: Base film
123: Release layer
124: Adhesive layer
130: Protective layer
131: Protective film
140: Adherend
510: Organic light emitting element
511: Back plate
512: Plastic substrate
513: Thin film transistor
514: Organic light emitting diode
515: Encapsulation layer

BEST MODE

Before describing the present invention, some terms are defined.

When one part "includes" one constituent element in the present specification, unless otherwise specifically described, this does not mean that another constituent element is excluded, but means that another constituent element can be further included.

In the present specification, 'p to q' means a range of 'p or more and q or less'.

In the present specification, (meth)acrylate means both acrylate and methacrylate.

In the present specification, the fact that a polymer includes a monomer as a monomer unit means that the monomer participates in a polymerization reaction, and thus is included as a repeating unit in the polymer. In the present specification, when the polymer includes a monomer, it is interpreted to be the same as when the polymer includes a monomer as a monomer unit.

In the present specification, the 'polymer' is understood to be used in a broad sense, including a copolymer, unless otherwise specified as a "homopolymer.".

In the present specification, the "monomer unit" means a state in which the compounds are polymerized and bound in a polymer. This means that in the structure of the compound, all or a portion of two or more substituents are omitted, and a radical for being bonded to other units of the polymer is located at the position.

In the present specification, a weight average molecular weight (Mw) and a number average molecular weight (Mn) are polystyrene-conversion molecular weights measured by gel permeation chromatography (GPC) using a monodisperse polystyrene polymer (standard sample) with various degrees of polymerization commercially available for the measurement of the molecular weight as a standard material. In the present specification, the molecular weight means a weight average molecular weight unless otherwise described. In the present specification, "parts by weight" or "wt %" is a value based on the solid content unless otherwise described.

Hereinafter, the present invention will be described in detail with reference to drawings, such that a person with ordinary skill in the art to which the present invention pertains can easily carry out the present invention. However, the present invention can be implemented in various different forms, and is not limited to the following description.

An exemplary embodiment of the present specification provides a surface protective film.

The surface protective film includes: a base layer; and an adhesive layer provided on one surface of the base layer, in which the adhesive layer includes a cured product of an adhesive composition including a urethane polymer; an acrylic polymer; and a curing agent, and a peel strength is 0.5 gf/in or more and 10 gf/in or less when a surface opposite to a surface of the adhesive layer on which the base layer is provided is peeled off from glass at a peel speed of 1.8 m/min and a peel angle of 180°.

When the peel strength of the adhesive layer satisfies the above range, the surface of the device can be prevented from being damaged at the time of peeling, while preventing the surface of the device from being contaminated during the manufacturing process of the organic light emitting element.

In an exemplary embodiment, the peel strength when a surface opposite to a surface of the adhesive layer on which the base layer is provided is peeled off from glass at a peel speed of 1.8 m/min and a peel angle of 180° is a peel strength when a surface protective film is cut so as to have a width of 25 mm and a length of 150 mm, then the adhesive layer of the surface protective film is attached to glass with a 2 kg roller, the glass is stored at a temperature of 25° C. for 24 hours, and then the surface protective film is peeled off from the glass at a peel speed of 1.8 m/min and a peel angle of 180° using a texture analyzer (manufactured by Stable Micro Systems, UK).

In the present specification, unless otherwise limited, 'glass' may mean alkali-free glass (manufactured by NEG Co., Ltd., OA-21).

In the surface protective film according to an exemplary embodiment of the present specification, the peel strength when a surface opposite to a surface of the adhesive layer on which the base layer is provided is peeled off from glass at a peel speed of 1.8 m/min and a peel angle of 180° is 0.5 gf/in or more. In an exemplary embodiment, the most preferred peel strength is 3 gf/in or more, but preferably 1 gf/in or more because there may be a significant difference for each base.

In the surface protective film according to an exemplary embodiment of the present specification, the peel strength when a surface opposite to a surface of the adhesive layer on which the base layer is provided is peeled off from glass at a peel speed of 1.8 m/min and a peel angle of 180° is 10 gf/in or less; preferably 8 gf/in or less.

In an exemplary embodiment, the peel strength when the surface protective film is peeled off from the glass at a peel speed of 1.8 m/min and a peel angle of 180° is a value measured at a temperature of 25° C. and a relative humidity of 50%.

In an exemplary embodiment, the relative humidity when the surface protective film is stored at 25° C. for 24 hours is 50%.

In an exemplary embodiment of the present specification, the acrylic polymer is included in an amount of 1 part by weight to 20 parts by weight based on 100 parts by weight of the urethane polymer. When the acrylic polymer is included in less than the above range, the effect of reducing the adhesive strength of the adhesive layer may be insignificant, and when the acrylic polymer is included in more than the above range, haze of the adhesive layer may be induced, so that it is preferred to satisfy the above range.

In an exemplary embodiment of the present specification, the acrylic polymer is included in an amount of 1 part by weight or more; or 3 parts by weight or more based on 100 parts by weight of the urethane polymer.

In an exemplary embodiment of the present specification, the acrylic polymer is included in an amount of 20 parts by weight or less; 15 parts by weight or less; or 12 parts by weight or less based on 100 parts by weight of the urethane polymer. When the content satisfies the numerical range, excellent optical characteristics of the adhesive layer can be maintained. Specifically, when the content satisfies the numerical range, the haze value can be maintained at low levels.

In an exemplary embodiment of the present specification, the haze value of the adhesive layer can be 3% or less, 2.5% or less, or 2% or less. In this case, excellent optical characteristics of the adhesive layer can be maintained.

In an exemplary embodiment of the present specification, the curing agent is included in an amount of 1 part by weight to 25 parts by weight based on 100 parts by weight of the urethane polymer. When the curing agent is included in more than the above range, a curable group (for example, an isocyanate group) remains in the adhesive layer, so that there is a problem in that the adhesive strength is increased, and when the curing agent is included in less than the above range, the cross-linking reaction is not sufficient, so that the adhesive strength of the adhesive layer can be increased at high temperature.

In an exemplary embodiment of the present specification, the curing agent is included in an amount of 25 parts by weight or less, or 20 parts by weight or less based on 100 parts by weight of the urethane polymer.

In an exemplary embodiment of the present specification, the curing agent is included in an amount of 1 part by weight or more; 5 parts by weight or more; or 10 parts by weight or more based on 100 parts by weight of the urethane polymer.

In an exemplary embodiment of the present invention, as the urethane polymer, a publicly known urethane polymer can be appropriately selected and used within the range of not reducing the effects of the present invention.

In an exemplary embodiment of the present invention, the urethane polymer means a polymer obtained by curing a urethane composition containing a polyol and a polyfunctional isocyanate compound.

As the polyol included in the urethane composition, any appropriate polyol can be used as long as it the polyol is a compound including two or more OH groups. In an exemplary embodiment, the polyol can include 2 to 6 OH groups, but the number of OH groups is not limited thereto.

One type or two or more types of polyols can be included in the urethane composition. When two or more polyols are used, the mixing ratio can be appropriately selected.

The number average molecular weight of the polyol included in the urethane composition can be appropriately selected. In an exemplary embodiment, the number average molecular weight of the polyol can be appropriately 100 g/mol to 20,000 g/mol, but is not limited thereto.

In an exemplary embodiment, the polyol included in the urethane composition can include a bifunctional polyol or trifunctional polyol. In an exemplary embodiment, a ratio of the trifunctional polyol in the polyols included in the urethane composition can be 70 wt % to 100 wt %; 80 wt % to 100 wt %; or 90 wt % to 100 wt %, and a ratio of the bifunctional polyol included in the urethane composition can be 0 wt % to 30 wt %; 0 wt % to 20 wt %; or 0 wt % to 10 wt %. In an exemplary embodiment, when the polyol includes a trifunctional polyol, it is advantageous to achieve a balance between the adhesive strength and the re-peelability of the adhesive layer.

In an exemplary embodiment, when the urethane composition includes a trifunctional polyol, as the trifunctional polyol, a polyol having a number average molecular weight of 10,000 g/mol to 15,000 g/mol and a polyol having a number average molecular weight of 1,000 g/mol to 5,000 g/mol can be used together.

In an exemplary embodiment, when the urethane composition includes a bifunctional polyol, the number average molecular weight of the bifunctional polyol can be 100 g/mol to 3,000 g/mol.

It is preferred that the polyol included in the urethane composition preferably does not include an additional functional group which is reactive with an isocyanate group (NC0).

The polyol included in the urethane composition can be, for example, a polyacryl polyol, a polyether polyol, a polyester polyol, a polycaprolactone polyol, a polycarbonate polyol, a castor oil-based polyol, and a combination thereof, but is not limited thereto.

In an exemplary embodiment, when a mixture of two types of polyols is used, the degree of dispersion of the molecular weight is easily adjusted. In an exemplary embodiment, the polyol includes 50 wt % to 100 wt % of a polyether polyol; and 0 wt % to 50 wt % of a polyester polyol. In an exemplary embodiment, the polyol includes 75 wt % to 95 wt % of a polyether polyol; and 5 wt % to 25 wt % of a polyester polyol.

As the isocyanate compound included in the urethane composition, any appropriate polyfunctional isocyanate compound typically used in the art can be selected and used as long as the compound is a compound that can be used for a urethanization reaction.

As the polyfunctional isocyanate compound, it is possible to use, for example, a polyfunctional aliphatic isocyanate, a polyfunctional alicyclic isocyanate, a polyfunctional aromatic isocyanate compound, a trimethylol propane adduct obtained by modifying a polyisocyanate with a trifunctional isocyanate, a biuret body obtained by allowing a polyisocyanate and water to react, a trimer having an isocyanurate ring, and the like, but the polyfunctional isocyanate compound is not limited thereto.

Examples of the polyfunctional aliphatic isocyanate compound include trimethylene diisocyanate, tetramethylene diisocyanate, pentamethylene diisocyanate, hexamethylene diisocyanate, 1,2-propylene diisocyanate, 1,3-butyelene diisocyanate, dodecamethylene diisocyanate, 2,4,4-trimethylhexamethylene diisocyanate, and the like, but are not limited thereto.

Examples of the polyfunctional alicyclic isocyanate compound include isophorone diisocyanate (IPDI), 1,4-cyclohexane diisocyanate (CHDI), 4,4'-dicyclohexylmethane diisocyanate (HMDI), bis(isocyanatomethyl) cyclohexane (HXDI), and the like, but are not limited thereto.

Examples of the polyfunctional aromatic isocyanate compound include toluene 2,4-diisocyanate (TDI), toluene 2,6-diisocyanate (TDI), 4,4'-methylene diphenyl diisocyanate (MDI), 2,4'-methylene diphenyl diisocyanate (MDI), polymeric methylene diphenyl diisocyanate (PMDI), p-phenylene diisocyanate (PDI), m-phenylene diisocyanate (PDI), naphthalene 1,5-diisocyanate (NDI), naphthalene 2,4-diisocyanate (NDI), p-xylylene diisocyanate (XDI), 1,3-bis(1-isocyanato-1-methylethyl)benzene (TMXDI), and the like, but are not limited thereto.

In an exemplary embodiment of the present specification, two or more isocyanate compounds can be used in mixture with the urethane composition, and in this case, the types and contents of the two or more isocyanate compounds can be appropriately selected. For example, as the isocyanate compound included in the urethane composition, a mixture of a polyfunctional aromatic isocyanate compound and a polyfunctional aliphatic isocyanate compound can be used.

In the urethane composition, a mixing ratio of the polyol and the isocyanate compound can be appropriately selected.

In an exemplary embodiment, the urethane composition can further include other components within the range not reducing the effects of the present invention. For example, the urethane composition can further include a catalyst, a plasticizer, an antioxidant, a leveling agent, a solvent, and the like.

As the method for polymerizing the urethane polymer, any publicly known and appropriate method can be selected, and in an exemplary embodiment, a method such as solution polymerization can be used.

In an exemplary embodiment of the present specification, the acrylic polymer includes an alkyl(meth)acrylate monomer having 10 or more carbon atoms as a monomer unit. The alkyl(meth)acrylate monomer of the acrylic polymer imparts hydrophobic characteristics to the adhesive layer, and particularly when the number of carbon atoms of the alkyl (meth)acrylate alkyl group is 10 or more, hydrophobic characteristics are further exhibited, so that the effect of reducing the adhesive strength of the adhesive layer to the adherend is obviously shown.

In an exemplary embodiment, the alkyl(meth)acrylate monomer having 10 or more carbon atoms is included in an amount of 1 wt % or more; 5 wt % or more; or 7 wt % or more, based on the total amount of the monomer unit included in the acrylic polymer.

In an exemplary embodiment, the alkyl(meth)acrylate monomer having 10 or more carbon atoms is included in an amount of 20 wt % or less based on the total amount of the monomer unit included in the acrylic polymer. When the alkyl(meth)acrylate monomer having 10 or more carbon atoms is included in more than the above range, the compatibility of the acrylic polymer and the urethane polymer deteriorates, so that there is a problem in that haze is caused.

In an exemplary embodiment of the present specification, the acrylic polymer includes a (meth)acrylate monomer including a hydroxyl group as a monomer unit. The (meth) acrylate monomer including the hydroxyl group implements low peel strength characteristics of the adhesive layer by enabling the urethane polymer and the acrylic polymer to be cross-linked.

In an exemplary embodiment of the present specification, the (meth)acrylate monomer including the hydroxyl group is included in an amount of 1 wt % or more based on the total amount of the monomer unit included in the acrylic polymer.

In an exemplary embodiment of the present specification, the (meth)acrylate monomer including the hydroxyl group is included in an amount of 20 wt % or less; 15 wt % or less; or 12 wt % or less, based on the total amount of the monomer unit included in the acrylic polymer. When the (meth)acrylate including the hydroxyl group is included in an amount of more than 20 wt %, the degree of cure of the acrylic polymer with the urethane polymer is increased, so that there is a problem in that the adhesive becomes hard.

In an exemplary embodiment of the present specification, the acrylic polymer includes an alkyl(meth)acrylate monomer having 10 or more carbon atoms; and a (meth)acrylate monomer including a hydroxyl group as a monomer unit.

In the present specification, alkyl(meth)acrylate means $CH_2CR_{31}COOR_{32}$, $R_{31}$ is hydrogen; or a methyl group, and $R_{32}$ means an alkyl group. In an exemplary embodiment, an alkyl(meth)acrylate having less than 10 carbon atoms means an acrylate in which the number of carbon atoms of $R_{32}$ is less than 10, and an alkyl(meth)acrylate having 10 or more carbon atoms means an acrylate in which the number of carbon atoms of $R_{32}$ is 10 or more.

In an exemplary embodiment of the present specification, a (meth)acrylate monomer including a hydroxyl group can be 2-hydroxyethyl(meth)acrylate, 2-hydroxypropyl(meth) acrylate, 2-hydroxybutyl(meth)acrylate, 4-hydroxybutyl (meth)acrylate, 6-hydroxyhexyl(meth)acrylate, polyethylene glycol(meth)acrylate, polypropylene glycol(meth) acrylate, polybutylene glycol(meth)acrylate, and the like, but is not limited thereto.

In an exemplary embodiment of the present specification, a (meth)acrylate monomer including a hydroxyl group is an alkyl(meth)acrylate monomer substituted with one or more hydroxyl groups.

In an exemplary embodiment of the present specification, as the (meth)acrylate monomer including the hydroxyl group, a mixture of two or more (meth)acrylate monomers including a hydroxyl group can be used. The mixing ratio is not particularly limited, and can be appropriately selected, if necessary.

In an exemplary embodiment of the present specification, the acrylic polymer can further include other monomer components (other monomers) polymerizable with the (meth)acrylate monomer within the range not inhibiting the effects of the present invention, in addition to the alkyl (meth)acrylate monomer having 10 or more carbon atoms; and the (meth)acrylate monomer including the hydroxyl group.

The other monomers can be a (meth)acrylate such as an alkyl(meth)acrylate having less than 10 carbon atoms, cyclohexyl(meth)acrylate, and aromatic(meth)acrylate, and the like, but are not limited thereto.

Examples of the alkyl(meth)acrylate having less than 10 carbon atoms include methyl(meth)acrylate, ethyl(meth) acrylate, n-propyl(meth)acrylate, isopropyl(meth)acrylate, n-butyl(meth)acrylate, t-butyl(meth)acrylate, sec-butyl (meth)acrylate, pentyl(meth)acrylate, 2-ethylbutyl(meth) acrylate, and the like, but are not limited thereto.

Examples of the aromatic (meth)acrylate include orthobiphenyl(meth)acrylate, metabiphenyl(meth)acrylate, parabiphenyl(meth)acrylate, 2,6-terphenyl(meth)acrylate, orthoterphenyl(meth)acrylate, metaterphenyl(meth)acrylate, paraterphenyl(meth)acrylate, 4-(4-methylphenyl)phenyl (meth)acrylate, 4-(2-methylphenyl)phenyl(meth)acrylate, 2-(4-methylphenyl)phenyl(meth)acrylate, 2-(2-methylphenyl)phenyl(meth)acrylate, 4-(4-ethylphenyl)phenyl(meth) acrylate, 4-(2-ethylphenyl)phenyl(meth)acrylate, 2-(4-ethylphenyl)phenyl(meth)acrylate, 2-(2-ethylphenyl)phenyl (meth)acrylate, and the like, but are not limited thereto.

Examples of other (meth)acrylate monomers that can be included in the acrylic polymer include cyclohexyl(meth) acrylate, phenoxy(meth)acrylate, 2-ethylphenoxy(meth) acrylate, benzyl(meth)acrylate, phenyl(meth)acrylate, 2-ethylthiophenyl(meth)acrylate, 2-phenylethyl(meth)acrylate, 3-phenylpropyl(meth)acrylate, 4-phenylbutyl(meth)acrylate, 2,2-methylphenylethyl(meth)acrylate, 2,3-methylphenylethyl(meth)acrylate, 2,4-methylphenylethyl(meth)acrylate, 2-(4-propylphenyl)ethyl(meth)acrylate, 2-(4-(1-methylethyl)phenyl)ethyl(meth)acrylate, 2-(4-methoxyphenyl)ethyl(meth)acrylate, 2-(4-cyclohexylphenyl)ethyl (meth)acrylate, 2-(2-chlorophenyl) ethyl(meth)acrylate, 2-(3-chlorophenyl)ethyl(meth)acrylate, 2-(4-chlorophenyl)ethyl(meth)acrylate, 2-(4-bromophenyl) ethyl(meth)acrylate, 2-(3-phenylphenyl)ethyl(meth)acrylate, 2-(4-benzylphenyl)ethyl(meth)acrylate, and the like, but are not limited thereto.

In an exemplary embodiment, the acrylic polymer further includes an alkyl(meth)acrylate monomer having less than 10 carbon atoms as a monomer unit.

In an exemplary embodiment, the acrylic polymer is a random polymer of an alkyl(meth)acrylate monomer having less than 10 carbon atoms; an alkyl(meth)acrylate monomer having 10 or more carbon atoms; and a (meth)acrylate monomer including a hydroxyl group.

In an exemplary embodiment, the acrylic polymer is a random polymer of 60 wt % to 98 wt % of an alkyl(meth) acrylate monomer having less than 10 carbon atoms; 1 wt % to 20 wt % of an alkyl(meth)acrylate monomer having 10 or more carbon atoms; and 1 wt % to 20 wt % of a (meth) acrylate monomer including a hydroxyl group.

In an exemplary embodiment, the acrylic polymer is a random polymer of 70 wt % to 98 wt % of an alkyl(meth) acrylate monomer having less than 10 carbon atoms; 1 wt % to 15 wt % of an alkyl(meth)acrylate having 10 or more carbon atoms; and 1 wt % to 15 wt % of a (meth)acrylate monomer including a hydroxyl group.

In an exemplary embodiment of the present specification, the acrylic polymer can be polymerized using generally used various polymerization methods, such as solution polymerization, peracid polymerization, suspension polymerization, emulsion polymerization, and radiation curing polymerization.

In the present specification, the acrylic polymer can be a random copolymer having a form in which monomers are mixed irregularly, a block copolymer in which blocks arranged in predetermined intervals are repeated, or an alternating copolymer having a form in which monomers are polymerized alternately repeatedly.

In an exemplary embodiment of the present specification, the urethane polymer has a weight average molecular weight of 60,000 g/mol to 160,000 g/mol. There are problems in that when the weight average molecular weight of the urethane polymer is less than 60,000 g/mol, the urethane polymer becomes hard and fragile, and when the weight average molecular weight of the urethane polymer is more than 160,000 g/mol, the urethane polymer is gelled.

In an exemplary embodiment of the present specification, the acrylic polymer has a weight average molecular weight of 10,000 g/mol or more; 15,000 g/mol or more; or 20,000 g/mol or more.

In an exemplary embodiment of the present specification, the acrylic polymer has a weight average molecular weight of 60,000 g/mol or less; 55,000 g/mol or less; 50,000 g/mol or less; or 40,000 g/mol or less.

When the molecular weight of the acrylic polymer is less than 10,000 g/mol, the adhesive migrates from the adhesive layer to the surface of the adherend, so that a problem such as contamination may occur, and when the molecular weight of the acrylic polymer is 60,000 g/mol or less, the compatibility with the urethane polymer is secured, so that the generation of haze in the adhesive layer can be minimized, and accordingly, it is preferred to satisfy the above range.

In an exemplary embodiment, the urethane polymer includes an OH group.

In an exemplary embodiment, the acrylic polymer has a hydroxyl group value of 5 mgKOH/g to 40 mgKOH/g. When the hydroxyl group value of the acrylic polymer exceeds the above range, the adhesive layer after the curing may be hard, so that it is preferred to satisfy the above range. In the present specification, the hydroxyl group value of the acrylic polymer means the hydroxyl group value of the solid content of the acrylic polymer unless otherwise specified.

For the adhesive composition according to an exemplary embodiment of the present invention, the acrylic polymer can be cross-linked with the urethane polymer when an adhesive layer is formed because the acrylic polymer includes a hydroxyl group. An adhesive layer formed using the adhesive composition can be peeled off from an adherend even with a low peel strength, and after the adhesive layer is peeled off from the adherend, the amount of residue on the surface of the adherend is small.

In the present specification, the hydroxyl group value of the compound can be measured by a titration method. A method for measuring the hydroxyl group value by a titration method is as follows. 1 g of a compound to be measured is introduced into 25.5 g of an acetylation reagent, and the resulting mixture is stirred in an oil bath at 100° C. for 2 hours. After air cooling for 30 minutes, 10 ml of pyridine is introduced thereinto. Thereafter, 50 ml (51 g) of 0.5 N KOH, a magnetic bar, and 10 drops of a phenolphthalein indicator are introduced thereinto, and the resulting solution is titrated with 0.5 N KOH until the solution turns pink while the resulting solution is stirred on a plate.

Acetylation reagent: a solution obtained by mixing 70 g of anhydrous phthalic acid and 500 g of pyridine Phenolphthalein indicator: a solution obtained by mixing 0.5 g of a phenolphthalein stock solution, 250 g of ethanol, and 250 g of distilled water The hydroxyl group value can be calculated by the following equation.

$$\text{Hydroxyl group value} = 28.05 \times (A-B) \times F/(\text{amount of sample})$$

A: 0.5 N KOH (ml) required for a blank

B: 0.5 N KOH (ml) required for the present test

F: Amount (ml) of KOH when a magnetic bar and 10 drops of a phenolphthalein indicator are put into 10 ml of 1 N HCL and then the resulting solution is titrated with 0.5 N KOH In an exemplary embodiment of the present specification, the curing agent is an isocyanate-based curing agent.

In an exemplary embodiment of the present specification, the isocyanate-based curing agent can be selected from an oligomer, polymer, and cyclic monomer of a diisocyanate compound, or a typical aliphatic or aromatic diisocyanate compound, and an oligomer of a commercially available diisocyanate compound, and the like can be obtained and used.

In an exemplary embodiment of the present specification, as the isocyanate-based curing agent, it is possible to use an aromatic cyclic diisocyanate compound having a benzene ring, such as 2,4- or 2,6-toluene diisocyanate (TDI), 4,4'-diphenylmethane diisocyanate (MDI), xylene diisocyanate (XDI), and 1,5-napthalene diisocyanate; an aliphatic non-cyclic diisocyanate such as hexamethylene diisocyanate (HDI), propylene diisocyanate, lysine diisocyanate, and 2,2,4- or 2,4,4-trimethylhexamethylene diisocyanate; an aliphatic cyclic diisocyanate compound such as 1,4-cyclohexane diisocyanate, isophorone diisocyanate (IPDI), and 4,4'-dicyclohexylmethane diisocyanate (H12MDI); and a combination thereof, but the isocyanate-based curing agent is not limited thereto.

In an exemplary embodiment of the present specification, the isocyanate-based curing agent includes one or more of an aliphatic cyclic isocyanate compound and an aliphatic non-cyclic isocyanate compound.

In an exemplary embodiment of the present specification, the adhesive composition can be used by mixing two or more isocyanate-based curing agents, and the ratio thereof can be appropriately selected and used.

In an exemplary embodiment of the present specification, the adhesive composition further includes a solvent. As the solvent, it is possible to use a publicly-known appropriate solvent, for example, ketone-based, acetate-based, toluene-based solvents, and the like, but the solvent is not limited thereto.

In an exemplary embodiment of the present specification, the adhesive composition further includes a catalyst. The catalyst can be appropriately selected in consideration of the purpose of the present application, and can be included at a concentration of, for example, 10 ppm to 500 ppm based on the urethane polymer.

As the catalyst, it is possible to use a tin-based catalyst such as dibutyl tin dilaurate (DBTDL), a lead-based catalyst, salts of organic and inorganic acids, an organic metal derivative, an amine-based catalyst, a diazabicycloundecene-based catalyst, and the like, but the catalyst is not limited thereto.

In an exemplary embodiment of the present specification, the adhesive composition further includes a curing retarding agent. As the curing retarding agent, any appropriate material which is publicly known can be used, and the content of the curing retarding agent can be appropriately selected. In an exemplary embodiment, as the curing retarding agent, acetylacetone can be used.

In an exemplary embodiment of the present specification, the adhesive composition can further include various general additives.

In the present specification, a cured product of the above-described adhesive composition means a cured product of the acrylic polymer; the urethane polymer; and the curing agent. The cured product is a material formed by a OH—NCO cross-linking reaction of an NCO group of the curing agent with a part or whole of OH groups of the urethane polymer and a part or whole of OH groups of the acrylic polymer. Here, the OH—NCO cross-linking reaction means a reaction of forming a —O—C(═O)—NH— group by allowing a —OH group and a —NCO group to react.

By cross-linking the urethane polymer and the acrylic polymer with a curing agent, it is possible to implement an adhesive layer that can be peeled off from an adherend even with a lower peel strength.

Hereinafter, the structure of the surface protective film of the present invention will be described in more detail.

In an exemplary embodiment of the present specification, the base layer includes: a base film; and a first anti-static layer and a second anti-static layer respectively provided on both surfaces of the base film, and the adhesive layer is provided on a surface opposite to a surface of the second anti-static layer on which the base film is provided.

Figure 2:
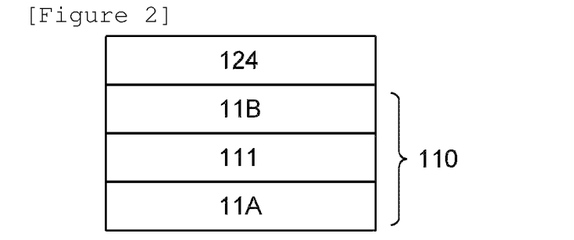
FIG. 2 illustrates a surface protective film including: an adhesive layer 124; and a base layer 110.

Referring to FIG. 2, the surface protective film according to an exemplary embodiment of the present specification sequentially includes a first anti-static layer 11A, a base film 111, a second anti-static layer 11B, and an adhesive layer 124.

In an exemplary embodiment of the present specification, the surface protective film further includes a protective layer provided on a surface opposite to a surface of the adhesive layer on which the base layer is provided, the protective layer includes: a protective film; and a third anti-static layer and a fourth anti-static layer respectively provided on both surfaces of the protective film, and the adhesive layer is provided on a surface opposite to a surface of the third anti-static layer on which the protective film is provided.

In an exemplary embodiment of the present specification, the protective layer further includes a release layer provided on a surface opposite to a surface of the third anti-static layer on which the protective film is provided. In this case, the adhesive layer is provided on a surface opposite to a surface of the release layer on which the third anti-static layer is provided.

Figure 1:
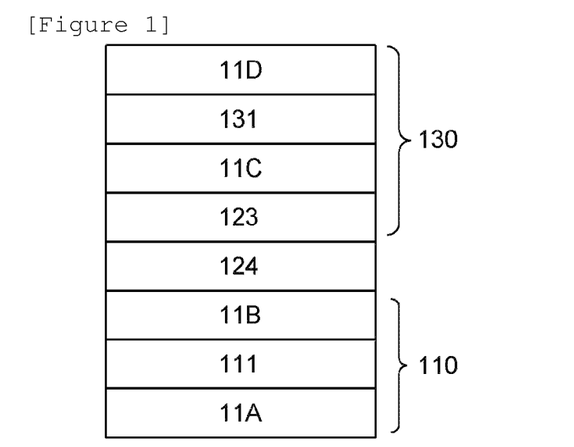
FIG. 1 illustrates a surface protective film including: a base layer 110; an adhesive layer 124; and a protective layer 130.

Referring to FIG. 1, the surface protective film according to an exemplary embodiment of the present specification sequentially includes a first anti-static layer 11A, a base film 111, a second anti-static layer 11B, an adhesive layer 124, a release layer 123, a third anti-static layer 11C, a protective film 131, and a fourth anti-static layer 11D.

The type of base film is not particularly limited. As the base film, it is possible to use, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-acrylic acid ethyl copolymer film, an ethylene-acrylic acid methyl copolymer film, a polyimide film, and the like, but the base film is not limited thereto. In an exemplary embodiment of the present invention, the base film can be a polyethylene terephthalate (PET) film.

The thickness of the base film can be appropriately selected in consideration of the purpose of the present application. For example, the thickness of the base film can be 25 µm or more and 150 µm or less; 50 µm or more and 125 µm or less; or 50 µm or more and 100 µm or less. When the range of the base film is in less than the above thickness range at the time of laminating the surface protective film to the encapsulation layer of the organic light emitting element, there is a concern in that the base film is easily deformed, and when the range of the base film is in more than the above thickness range, lamination defect may occur.

The base film may have been subjected to an appropriate adhesive treatment such as, for example, a corona discharge treatment, an ultraviolet irradiation treatment, a plasma treatment, or a sputter etching treatment, but the treatment is not limited thereto.

In an exemplary embodiment, the base film can be directly attached to a first and/or second anti-static layer. In another exemplary embodiment, when the base film is surface-treated, a first and/or second anti-static layer can be attached to the surface-treated base film.

In the present specification, the term 'anti-static layer' means a layer intended to suppress the generation of static electricity.

The first to fourth anti-static layers can be formed by a publicly known method in order to achieve a desired effect. For example, the first to fourth anti-static layers can be formed on both surfaces of the base film and both surfaces of the protective film by an in-line coating method.

In the present invention, the first to fourth anti-static layers can be formed of an appropriate anti-static composition in consideration of the purpose of the present application. For example, the first to fourth anti-static layers can include one or a mixture thereof selected from the group consisting of an acrylic resin, a urethane-based resin, a urethane-acrylic copolymer, an ester-based resin, an ether-based resin, an amide-based resin, an epoxy-based resin, and a melamine resin, but are not limited thereto.

In one example, the first to fourth anti-static layers can include a conductive material. The conductive material can include a conductive polymer or carbon nanotube, but is not limited thereto.

The conductive polymer may consist of, for example, a polyaniline-, polypyrrole-, polythiophene-based polymer, a derivative thereof, and a copolymer thereof, but is not limited thereto.

The carbon nanotube can have a tubular form produced by rolling a graphite plate formed by connecting hexagonal rings each consisting of 6 carbon atoms. The carbon nanotube is excellent in rigidity and electrical conductivity, so that when the carbon nanotube is used as an anti-static layer of a surface protective film, the hardness of the anti-static layer can be increased, and the anti-static function can be improved.

The thicknesses of the first to fourth anti-static layers can be appropriately selected in consideration of the purpose of the present application, and the thicknesses of the respective anti-static layers can be the same as or different from each other.

In an exemplary embodiment, the first to fourth anti-static layers can each independently have a thickness of 10 nm or more and 400 nm or less, preferably 20 nm or more and 300 nm or less; or 20 nm or more and 100 nm or less. The first to fourth anti-static layers can have a thickness within the above-described range, so that both surfaces of the base film or both surfaces of the protective film can have excellent coatability.

In an exemplary embodiment, the surface resistances of the first to fourth anti-static layers can be appropriately selected in consideration of the purpose of the present application. For example, the surface resistances of the first to fourth anti-static layers are each independently $10^4$ Ω/sq or more; $10^5$ Ω/sq or more; $10^6$ Ω/sq or more; $10^7$ Ω/sq or more; $10^8$ Ω/sq or more; or $10^9$ Ω/sq or more. For example, the surface resistances of the first to fourth anti-static layers can be each independently $5 \times 10^{12}$ Ω/sq or less; or $10^{11}$ Ω/sq or less. When the first to fourth anti-static layers have a surface resistance within the above-described range, the surface protective film can have an excellent anti-static function.

In an exemplary embodiment, the first and second anti-static layers are directly brought into contact with both surfaces of the base film, respectively. In an exemplary embodiment, the third and fourth anti-static layers are directly brought into contact with both surfaces of the protective film, respectively.

The adhesive layer according to an exemplary embodiment of the present invention can be provided while being brought into contact with one surface of the second anti-static layer, thereby reducing a cumulative amount of static electricity. Further, since the surface resistance of the adhesive layer is reduced, the generation of static electricity on the surface of the adhesive layer is reduced when the protective layer is peeled off from the surface protective film.

Thus, when the protective layer is removed from the surface protective film, or the surface protective film is peeled off from the surface of the adherend in order to attach the adhesive layer to the surface of the adherend, it is possible to prevent foreign materials which can be attached to the adhesive layer or adherend by static electricity. Further, it is possible to prevent characteristics of the surface of the adherend from deteriorating by preventing contamination of the surface of the adherend during the process.

In the present invention, the thickness of the adhesive layer can be appropriately selected in consideration of the purpose of the present application. For example, the adhesive layer can have a thickness of 10 μm or more; 30 μm or more; or 45 μm or more. For example, the adhesive layer can have a thickness of 200 μm or less; 150 μm or less; 100 μm or less; or 90 μm or less.

By setting the thickness of the adhesive layer in the above range, the adhesiveness and wettability of the adhesive layer to the surface of the adherend can be improved.

The protective film can include one or more selected from the group consisting of, for example, polyethylene terephthalate; polytetrafluoroethylene; polyethylene; polypropylene; polybutene; polybutadiene; a vinyl chloride copolymer; polyurethane; ethylene-vinyl acetate; an ethylene-propylene copolymer; an ethylene-acrylic acid ethyl copolymer; an ethylene-acrylic acid methyl copolymer; polyimide; nylon; a styrene-based resin or elastomer; a polyolefin-based resin or elastomer; other elastomers; a polyoxyalkylene-based resin or elastomer; a polyester-based resin or elastomer; a polyvinyl chloride-based resin or elastomer; a polycarbonate-based resin or elastomer; a polyphenylenesulfide-based resin or elastomer; a hydrocarbon mixture; a polyamide-based resin or elastomer; an acrylate-based resin or elastomer; an epoxy-based resin or elastomer; a silicone-based resin or elastomer; and a liquid crystal polymer, but is not limited thereto.

The thickness of the protective film can be appropriately selected in consideration of the purpose of the present application. The thickness can be, for example, 25 μm or more and 150 μm or less; 25 μm or more and 125 μm or less; or 25 μm or more and 100 μm or less. When the thickness of the protective film is in less than the above range, there is a concern in that the protective film is easily deformed at the time of laminating the surface protective film on which an adhesive layer is formed to an encapsulation layer of an organic light emitting element, and when the thickness of the protective film is in more than the above range, lamination defect may occur.

A material for the release layer can be appropriately selected according to the purpose of the present invention. As the material for the release layer, it is possible to use, for example, a silicone-based release agent, a fluorine-based release agent, a long-chain alkyl-based release agent, a fatty acid amide-based release agent, and the like, but the material is not limited thereto. In an exemplary embodiment, as the material for the release layer, a silicone-based release agent can be used.

As the silicone-based release agent, for example, an addition reaction type silicone polymer can be used.

The release layer can be formed by applying the material for the release layer to a third anti-static layer and drying the applied material. As a method for coating and drying the material for the release layer, any appropriate coating method can be appropriately used.

The thickness of the release layer can be appropriately selected in consideration of the purpose of the present application. For example, the thickness of the release layer can be 10 nm or more and 500 nm or less; 10 nm or more and 300 nm or less; or 10 nm or more and 200 nm or less. When the release layer does not have the above-described thickness, defects of the film may occur during the process, so that it is preferred to have the thickness.

In an exemplary embodiment, the surface protective film is a surface protective film for protecting a surface of an organic light emitting element during a process of manufacturing an organic light emitting electronic device.

In an exemplary embodiment, the adhesive layer of the surface protective film can be used while being attached to the surface of a device to be protected. FIG. 2 illustrates a state in which the protective layer is removed from the surface protective film in FIG. 1.

Figure 3:
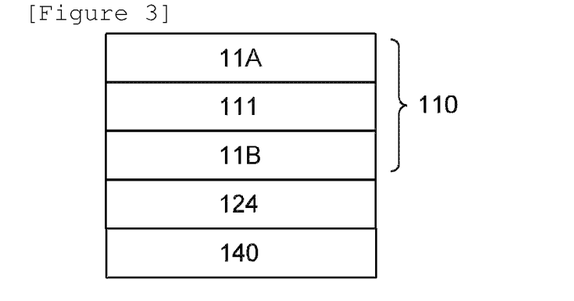
FIG. 3 illustrates a form in which the surface protective film in FIG. 2 is attached to an adherend 140.

FIG. 3 illustrates a form in which the surface protective film in FIG. 2 is attached to a surface of an adherend 140 in order to protect the surface of the adherend.

In the present specification, the adherend means a material to which the adhesive layer can be adhered. In an exemplary embodiment, the adherend includes an encapsulation layer of an organic light emitting element and a plastic substrate applied to the element, but is not limited thereto.

Another exemplary embodiment of the present specification provides a method for manufacturing a surface protective film. The manufacturing method relates to a method for manufacturing, for example, the above-described surface protective film. Accordingly, the content on the above-described surface protective film can be equally applied to a surface protective film formed by a method for manufacturing a surface protective film to be described below.

In one example, the method for manufacturing a surface protective film includes: preparing a base layer; preparing a protective layer; and joining the base layer and the protective layer by an adhesive layer so as to face each other.

In another example, the method for manufacturing a surface protective film can include: forming a base layer including a base film, and a first anti-static layer and a second anti-static layer respectively provided on both surfaces of the base film; forming a protective layer including a protective film, a third anti-static layer and a fourth anti-static layer respectively provided on both surfaces of the protective film, and a release layer provided on a surface opposite to a surface of the third anti-static layer on which the protective film is provided; and joining the base layer and the protective layer by an adhesive layer, such that the second anti-static layer and the release layer face each other.

In an exemplary embodiment, the method for manufacturing a surface protective film can further include: forming an adhesive layer on one surface of the second anti-static layer of the base layer before the joining of the base layer and the protective layer by the adhesive layer. In this case, the joining of the base layer and the protective layer can be joining the base layer and the protective layer, such that the adhesive layer and the release layer face each other.

The forming of the adhesive layer on one surface of the second anti-static layer of the base layer includes: coating a surface opposite to a surface of the second anti-static layer on which the base film is provided with the adhesive composition; and curing the coated adhesive composition.

As a method for coating the surface with the adhesive composition, it is possible to use a publicly known coating method such as a reverse coating method, a gravure coating method, a spin coating method, a screen coating method, a fountain coating method, a dipping method, and a spray method, but the method is not limited thereto.

The coated adhesive composition can be cured at appropriate temperature for appropriate time. In an exemplary embodiment, the coated adhesive composition can be cured through aging in an oven at 40° C. for about 5 days, but the curing is not limited thereto.

An exemplary embodiment of the present specification provides a method for manufacturing an organic light emitting electronic device.

In an exemplary embodiment of the present specification, the method for manufacturing an organic light emitting electronic device includes attaching an adhesive layer of the above-described surface protective film onto an encapsulation layer of an organic light emitting element.

In an exemplary embodiment, when the surface protective film further includes a protective layer, the method for manufacturing an organic light emitting electronic device further includes: removing a protective layer from the surface protective film before the attaching of the adhesive layer onto the encapsulation layer.

In an exemplary embodiment of the present specification, the organic light emitting element sequentially includes a back plate, a plastic substrate, a thin film transistor, an organic light emitting diode, and an encapsulation layer.

Figure 4:
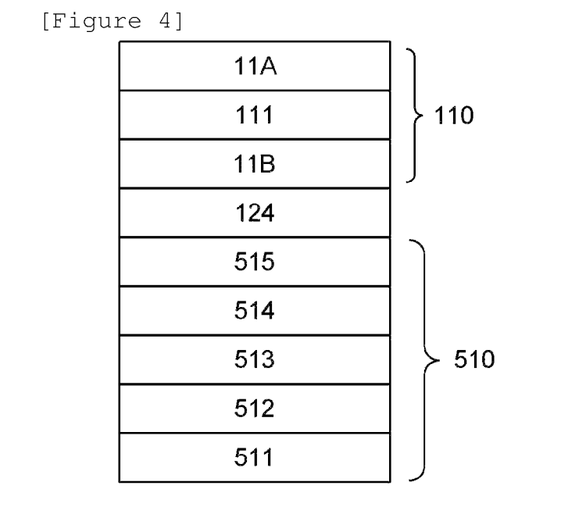
FIG. 4 illustrates a state in which the adherend in FIG. 3 is an organic light emitting element 510.

FIG. 4 is a view exemplarily illustrating a state in which the surface protective film according to an exemplary embodiment of the present invention is attached onto an encapsulation layer during a process of manufacturing an organic light emitting electronic device. Referring to FIG. 4, the surface protective film in FIG. 2 according to an exemplary embodiment of the present invention is attached onto an encapsulation layer 515 of an organic light emitting element 510 sequentially including a back plate 511, a plastic substrate 512, a thin film transistor 513, an organic light emitting diode 514, and the encapsulation layer 515, such that the adhesive layer and the encapsulation layer face each other.

The encapsulation layer can exhibit excellent moisture blocking characteristics and optical characteristics in the organic light emitting electronic device. Further, the encapsulation layer can be formed as a stable encapsulation layer regardless of the form of an organic light emitting electronic device such as top emission or bottom emission.

In an exemplary embodiment, the encapsulation layer can include a single layer or multi-layers of an inorganic material layer. As a method for forming the encapsulation layer, a typical method for forming an encapsulation layer known in the art can be applied.

The single layer or multi-layers of inorganic material layer can include, for example, an aluminum oxide-based inorganic material layer, a silicon nitride-based inorganic material layer, a silicon oxynitride-based inorganic material layer, and the like.

The method for manufacturing an organic light emitting electronic device of the present application can further include: peeling off the surface protective film from the encapsulation layer; and stacking a touch screen panel and a cover window on the encapsulation layer. Since the surface protective film exhibits an excellent anti-static function in an encapsulation layer at the time of being peeled off from the encapsulation layer, defects of an element can be prevented by preventing foreign materials from being attached between the encapsulation layer and the touch screen at the time of joining a touch screen panel onto the encapsulation layer.

Mode for Invention

Hereinafter, the present application will be described in more detail through the Examples which follows the present application and the Comparative Examples which do not follow the present application, but the scope of the present application is not limited by the Examples suggested below.

Preparation Example 1—Preparation of Adhesive Composition 1

<Preparation of Urethane Polymer>

Into a three-neck flask filled with a nitrogen gas, 80 parts by weight of trifunctional preminol (polyether polyol, S 4013F, ASAHI GLASS CO., LTD., Mn=12,000 g/mol), 5 parts by weight of a bifunctional polyol (polypropylene glycol, PPG-1000d, Kumho Petrochemical, Mn=1,000 g/mol), and 15 parts by weight of a trifunctional MPD/TMPT-based polyol (a mixture of 3-methyl-1,5-pentanediol (MPD) and trimethylol propane adipate (TMPT), Polyol F-3010, Kuraray Co., Ltd., Mn=3,000 g/mol), and ethyl acetate were introduced, and the resulting mixture was stirred at high speed for 15 minutes in the presence of a catalyst (DBTDL). Next, while slowly adding dropwise 18 parts by weight of a polyfunctional alicyclic isocyanate compound (MHG-80B, Asahi Kasei Corporation) based on 100 parts by weight of the Preminol, the polyol, and the MPD/TMPT-based polyol, the mixture was heated, maintained at 90±5° C. for 3 hours, and allowed to react until the isocyanate (NCO) peak disappeared, thereby preparing a urethane polymer having a weight average molecular weight of 110,000 g/mol.

<Preparation of Acrylic Polymer (D1)>

After a monomer mixture consisting of 75 parts by weight of butyl methacrylate (BMA), 15 parts by weight of stearyl methacrylate (STMA), and 10 parts by weight of 2-hydroxybutyl acrylate (2-HBA) was introduced into a 1 L reactor equipped with a cooling device such that a nitrogen gas was refluxed and the temperature was easily adjusted, ethyl acetate as a solvent was introduced thereinto. Next, after purging with a nitrogen gas was performed for about 1 hour in order to remove oxygen, the reactor temperature was maintained at 62° C. After the mixture was homogenized, 400 ppm of azobisisobutyronitrile (AIBN) as a reaction initiator and 400 ppm of n-dodecylmercaptan (n-DDM) as a chain transfer agent were introduced thereinto, and the mixture was allowed to react. After the reaction, the reaction product was diluted with toluene, thereby preparing an acrylic polymer (D1) having a weight average molecular weight of 28,000 g/mol.

<Preparation of Adhesive Composition 1>

100 parts by weight of the prepared urethane polymer was mixed with 15 parts by weight of an HDI trimer-based curing agent (TKA-100, Asahi Kasei Corporation), 10 parts by weight of the acrylic polymer (D1), 0.005 part by weight of a catalyst (DBTDL), and 3 parts by weight of a curing retarding agent (acetylacetone) based on 100 parts by weight of the urethane polymer, a toluene solvent was added to the resulting mixture such that the concentration of the solid content became 48 wt %, and the resulting mixture was stirred by a disper, thereby preparing Adhesive Composition 1.

TKA-100

Preparation Example 2 Preparation of Adhesive Composition 2

An acrylic polymer (D2) having a molecular weight of 30,000 g/mol was prepared in the same manner as in the method for preparing an acrylic polymer (D1).

Adhesive Composition 2 was prepared in the same manner as in the method for preparing Adhesive Composition 1, except that 7.5 parts by weight of the acrylic polymer (D2) based on 100 parts by weight of the urethane polymer was used instead of the acrylic polymer (D1).

Preparation Example 3—Preparation of Adhesive Composition 3

An acrylic polymer (D3) having a weight average molecular weight of 31,000 g/mol was prepared in the same manner as in the method for preparing an acrylic polymer (D1), except that the weight ratio of BMA/STMA/2-HBA was set at 80:10:10 instead of 75:15:10.

Adhesive Composition 3 was prepared in the same manner as in the method for preparing Adhesive Composition 1, except that the acrylic polymer (D3) was used instead of the acrylic polymer (D1).

Preparation Example 4—Preparation of Adhesive Composition 4

An acrylic polymer (D4) having a weight average molecular weight of 30,000 g/mol was prepared in the same manner as in the method for preparing an acrylic polymer (D1), except that the weight ratio of BMA/STMA/2-HBA was set at 80:10:10 instead of 75:15:10.

Adhesive Composition 4 was prepared in the same manner as in the method for preparing Adhesive Composition 1, except that 7.5 parts by weight of the acrylic polymer (D4) based on 100 parts by weight of the urethane polymer was used instead of the acrylic polymer (D1).

Preparation Example 5—Preparation of Adhesive Composition 5

An acrylic polymer (D5) having a weight average molecular weight of 29,000 g/mol was prepared in the same manner as in the method for preparing an acrylic polymer (D1), except that the weight ratio of BMA/STMA/2-HBA was set at 80:10:10 instead of 75:15:10.

Adhesive Composition 5 was prepared in the same manner as in the method for preparing Adhesive Composition 1, except that 5 parts by weight of the acrylic polymer (D5) based on 100 parts by weight of the urethane polymer was used instead of the acrylic polymer (D1).

Preparation Example 6—Preparation of Adhesive Composition 6

Adhesive Composition 6 was prepared in the same manner as in the method for preparing Adhesive Composition 5, except that the content of the acrylic polymer (D5) was changed to 25 parts by weight based on 100 parts by weight of the urethane polymer.

Preparation Example 7—Preparation of Adhesive Composition 7

Adhesive Composition 7 was prepared in the same manner as in the method for preparing Adhesive Composition 6, except that the content of the acrylic polymer (D5) was changed to 30 parts by weight based on 100 parts by weight of the urethane polymer.

Comparative Preparation Example 1—Preparation of Comparative Composition 1

Comparative Composition 1 was prepared in the same manner as in the method for preparing Adhesive Composition 1, except that the acrylic polymer (D1) was not used.

Comparative Preparation Example 2—Preparation of Comparative Composition 2

Comparative Composition 2 was prepared in the same manner as in the method for preparing Adhesive Composition 1, except that 10 parts by weight of isopropyl myristate (IPMS) based on 100 parts by weight of the urethane polymer was used instead of the acrylic polymer (D1).

Preparation of Surface Protective Film

As a base layer, a polyethylene terephthalate (PET) film (H330, Kolon Industries, Inc.) having a thickness of 75 µm, in which both surfaces of a base film were respectively coated with an anti-static layer having a thickness of 50 nm, was prepared. As a protective layer, a film (12ASW, SKC Co., Ltd.) was prepared, in which an anti-static layer was formed on both surfaces of a polyethylene terephthalate (PET) film (XD510P, TAK Inc.) having a thickness of 50 µm and one anti-static layer was coated with a release layer. Next, one surface of the base layer was comma-coated with the adhesive composition to have a thickness of 75 µm and dried by hot wind, and then a protective layer was laminated onto the adhesive composition, such that the base layer and the release layer faced each other, the protective layer was aged at 40° C. for 5 days, and then a surface protective film was prepared.

Surface protective films in Examples 1 to 7 and Comparative Examples 1 and 2 were prepared in the same manner as in the method for preparing a surface protective film, except that as the adhesive composition, Adhesive Compositions 1 to 7 and Comparative Compositions 1 and 2 were used. The following Table 1 briefly compares the configurations of Examples 1 to 7 and Comparative Examples 1 and 2.

The peel strengths of the surface protective films in the Examples of the present application and the Comparative Examples were evaluated by the following method, and the results are shown in the following Table 2.

Measurement of Peel Strength

The surface protective films in Examples 1 to 7 and Comparative Examples 1 and 2 were cut so as to have a width of 25 mm and a length of 150 mm. Subsequently, an adhesive layer of a surface protective film was attached to glass using a 2 kg roller, and the surface protective film was stored at 25° C. for about 24 hours. Subsequently, while the surface protective film was peeled off from the glass at 25° C., a peel speed of 1.8 m/min, and a peel angle of 180° using an apparatus (Texture Analyzer, manufactured by Stable Micro Systems, UK), the peel strength was evaluated. After the peel strengths of the two same samples were measured, the average value thereof was adopted.

Measurement of Haze

The surface protective films in Examples 1 to 7 and Comparative Examples 1 and 2 were cut so as to have a width of 70 mm and a length of 70 mm. Hereinafter, the release layers were peeled off, and the haze values were measured using a hazemeter (HR-100, manufactured by Murakami Color Research Laboratory).

TABLE 1

| | Acrylic polymer molecular weight (g/mol) | Weight ratio of BMA/STMA/ 2-HBA | Acrylic polymer content (parts by weight) | Plasticizer type (parts by weight) |
|---|---|---|---|---|
| Example 1 | 28,0000 | 75:15:10 | 10 | — |
| Example 2 | 30,000 | 75:15:10 | 7.5 | — |
| Example 3 | 31,000 | 80:10:10 | 10 | — |
| Example 4 | 30,000 | 80:10:10 | 7.5 | — |
| Example 5 | 29,000 | 80:10:10 | 5 | — |
| Example 6 | 29,000 | 80:10:10 | 25 | — |
| Example 7 | 29,000 | 80:10:10 | 30 | — |
| Comparative Example 1 | — | — | — | — |
| Comparative Example 2 | — | — | — | IPMS(10) |

TABLE 2

| | Peel strength (gf/in) | Haze (PET/PSA) |
|---|---|---|
| Example 1 | 2.5 | 1.6 |
| Example 2 | 3 | 1.4 |
| Example 3 | 2.5 | 1.5 |
| Example 4 | 4.3 | 1.3 |
| Example 5 | 7 | 1.2 |
| Example 6 | 2.5 | 3.2 |
| Example 7 | 2.2 | 4.4 |
| Comparative Example 1 | 14 | 1.5 |
| Comparative Example 2 | 11 | 1.6 |

From Table 2, it can be confirmed that when the surface protective film of the present invention is used, the film can be peeled off with a low peel strength because the adhesive strength between the adhesive layer and the adherend is low.

Further, it could be confirmed that when the acrylic polymer of the adhesive layer is included in an amount of 1 part by weight to 20 parts by weight based on 100 parts by weight of the urethane polymer, haze is maintained at low levels.

The invention claimed is:

1. A surface protective film comprising:
a base layer; and
an adhesive layer provided on a surface of the base layer,
wherein the adhesive layer comprises a cured product of an adhesive composition comprising: a urethane polymer; an acrylic polymer; and a curing agent,
wherein the acrylic polymer consists of an alkyl(meth)acrylate monomer having 10 or more carbon atoms; an alkyl(meth)acrylate monomer having less than 10 carbon atoms; and a (meth)acrylate monomer comprising a hydroxyl group, each as a monomer unit,
wherein the alkyl(meth)acrylate monomer having 10 or more carbon atoms is comprised in an amount of 1 wt % to 20 wt % based on a total amount of the monomer units comprised in the acrylic polymer,
wherein the (meth)acrylate monomer comprising the hydroxyl group is comprised in an amount of 1 wt % to 20 wt % based on a total amount of the monomer units comprised in the acrylic polymer, and
wherein a peel strength of the adhesive layer is 0.5 gf/in or more and 10 gf/in or less when a surface of the adhesive layer, opposite to a surface on which the base layer is provided, is peeled off from glass at a peel speed of 1.8 m/min and a peel angle of 180°.

2. The surface protective film of claim 1, wherein, in the adhesive composition, the acrylic polymer is comprised in an amount of 1 part by weight to 20 parts by weight based on 100 parts by weight of the urethane polymer.

3. The surface protective film of claim 1, wherein, in the adhesive composition, the curing agent is comprised in an amount of 1 part by weight to 25 parts by weight based on 100 parts by weight of the urethane polymer.

4. The surface protective film of claim 1, wherein the acrylic polymer has a hydroxyl group value of 5 mgKOH/g to 40 mgKOH/g.

5. The surface protective film of claim 1, wherein the acrylic polymer has a weight average molecular weight of 10,000 g/mol to 60,000 g/mol.

6. The surface protective film of claim 1, wherein the urethane polymer has a weight average molecular weight of 60,000 g/mol to 160,000 g/mol.

7. The surface protective film of claim 1, wherein the base layer comprises a base film; a first anti-static layer provided on one surface of the base film; and a second anti-static layer provided on the other surface of the base film, and wherein the adhesive layer is provided on a surface of the second anti-static layer, which is opposite to the surface on which the base film is provided.

8. The surface protective film of claim 1, further comprising a protective layer provided on the surface of the adhesive layer, which is opposite to the surface on which the base layer is provided, wherein the protective layer comprises: a protective film; and a third anti-static layer and a fourth anti-static layer respectively provided on both surfaces of the protective film, and wherein the adhesive layer is provided on a surface of the third anti-static layer, which is opposite to the surface on which the protective film is provided.

* * * * *